United States Patent
Oh et al.

(10) Patent No.: US 8,995,203 B2
(45) Date of Patent: Mar. 31, 2015

(54) NON-VOLATILE MEMORY DEVICE, DRIVING METHOD OF MEMORY CONTROLLER CONTROLLING THE NON-VOLATILE MEMORY DEVICE AND MEMORY SYSTEM INCLUDING THE MEMORY CONTROLLER AND THE NON-VOLATILE MEMORY DEVICE

(71) Applicant: Samsung Electronics Co., Ltd., Suwon-si (KR)

(72) Inventors: Young-Hoon Oh, Hwaseong-si (KR); Du-Eung Kim, Yongin-si (KR); Woo-Yeong Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/077,851

(22) Filed: Nov. 12, 2013

(65) Prior Publication Data

US 2014/0160857 A1 Jun. 12, 2014

(30) Foreign Application Priority Data

Dec. 12, 2012 (KR) .................. 10-2012-0144546

(51) Int. Cl.
*G11C 16/06* (2006.01)
*G11C 13/00* (2006.01)

(52) U.S. Cl.
CPC ............ *G11C 16/06* (2013.01); *G11C 13/0069* (2013.01)
USPC ............. 365/185.23; 365/148; 365/189.14; 365/189.2; 365/205; 365/185.14

(58) Field of Classification Search
CPC .......... G11C 13/0004; G11C 13/0069; G11C 13/0038; G11C 2213/72; G11C 13/00; G11C 13/0023; G11C 2213/79; G11C 3/0007
USPC .............. 365/185.23, 148, 185.03, 185.14, 365/185.28, 189.14, 189.2, 205
See application file for complete search history.

(56) References Cited

U.S. PATENT DOCUMENTS

| | | | |
|---|---|---|---|
| 7,236,423 | B2 | 6/2007 | Sohn et al. |
| 7,573,774 | B2 | 8/2009 | Kwon et al. |
| 7,701,764 | B2 | 4/2010 | Nguyen |
| 7,764,551 | B2 | 7/2010 | Seo et al. |
| 7,787,297 | B2 | 8/2010 | Jeon et al. |

(Continued)

FOREIGN PATENT DOCUMENTS

| | | |
|---|---|---|
| JP | 2006-172700 | 6/2006 |
| JP | 2007-102994 | 4/2007 |
| JP | 2012-128918 | 7/2012 |
| KR | 10-2007-0008403 A | 1/2007 |
| KR | 10-2008-0096228 A | 10/2008 |

(Continued)

*Primary Examiner* — Thong Q Le
(74) *Attorney, Agent, or Firm* — Myers Bigel Sibley & Sajovec, P.A.

(57) ABSTRACT

The present inventive concept provides a driving method of memory controller controlling nonvolatile memory device using variable resistive element. The memory controller may control a plurality of first memory devices and a second memory device. A number of write drivers in the second memory device may be driven when a number of first memory devices among the plurality of first memory devices are used. A different number of write drivers in the second memory device may be driven when a different number of first memory devices among the plurality of first memory devices are used.

17 Claims, 23 Drawing Sheets

(56) References Cited

U.S. PATENT DOCUMENTS

| | | |
|---|---|---|
| 7,983,076 B2 | 7/2011 | Shin |
| 8,386,818 B2 | 2/2013 | Hong |
| 2009/0144484 A1 | 6/2009 | Sukegawa |
| 2010/0191898 A1 | 7/2010 | Kim et al. |
| 2012/0063190 A1 | 3/2012 | Koh |
| 2012/0140579 A1 | 6/2012 | Kim et al. |
| 2012/0155162 A1 | 6/2012 | Hanzawa |
| 2012/0224437 A1* | 9/2012 | Kim et al. ............ 365/189.09 |

FOREIGN PATENT DOCUMENTS

| | | |
|---|---|---|
| KR | 10-2008-0103229 A | 11/2008 |
| KR | 10-2009-0026205 A | 3/2009 |
| KR | 10-2010-0086776 A | 8/2010 |
| KR | 10-2010-0114241 A | 10/2010 |
| KR | 10-2010-0117857 A | 11/2010 |
| KR | 10-2012-0028484 A | 3/2012 |
| KR | 10-2012-0061558 A | 6/2012 |

* cited by examiner

FIG. 3

| 1_1 | 1_2 | 1_3 | 1_4 | 1_5 | 1_6 | 1_7 | 1_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(2_1) | | SA/WD(2_2) | | SA/WD(2_3) | | SA/WD(2_4) | |
| PERIPHERY(3) | | | | | | | |
| SA/WD(2_8) | | SA/WD(2_7) | | SA/WD(2_6) | | SA/WD(2_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

FIG. 6

| Command | CMD1 | CMD2 | CMD3 | CMD4 |
|---|---|---|---|---|
| # of write drivers (Internal Parallel Write Bit) | 4B | 8B | 16B | 32B |
| Average Consumption Current | $I_0$ | $2I_0$ | $4I_0$ | $8I_0$ |
| Write Cycle Number per 1KB | 256 | 128 | 64 | 32 |

NON-VOLATILE MEMORY DEVICE, DRIVING METHOD OF MEMORY CONTROLLER CONTROLLING THE NON-VOLATILE MEMORY DEVICE AND MEMORY SYSTEM INCLUDING THE MEMORY CONTROLLER AND THE NON-VOLATILE MEMORY DEVICE

CROSS-REFERENCE TO RELATED APPLICATION

This application claims priority under 35 U.S.C. §119 to Korean Patent Application No. 10-2012-0144546 filed on Dec. 12, 2012 in the Korean Intellectual Property Office, the contents of which in its entirety are herein incorporated by reference.

FIELD

The present inventive concept relates to memory, and more specifically, nonvolatile memory devices.

BACKGROUND

Examples of nonvolatile memory devices using a resistance material include a phase change random access memory (PRAM), a resistive RAM (RRAM), a magnetic RAM (MRAM), and the like. A dynamic RAM (DRAM) or a flash memory device stores data using charges, whereas the nonvolatile memory device using the resistance material stores data using a phase change of a phase change material such as a chalcogenide alloy (in the case of a PRAM), a resistance change of a variable resistance material (in the case of an RRAM), a resistance change of a magnetic tunnel junction (MTJ) thin film according to a magnetization state of a ferromagnetic material (in the case of an MRAM), and the like.

More specifically, the phase change material is changed to a crystalline state or an amorphous state as it is cooled after being heated. The phase change material in a crystalline state has a low resistance and the phase change material in an amorphous state has a high resistance. Accordingly, the crystalline state may be defined as set data or "0" data, and the amorphous state may be defined as reset data or "1" data.

SUMMARY

According to an exemplary embodiment of the inventive concept, there is provided a driving method of a memory controller capable of improving a program speed and reducing power consumption. The memory controller may control a plurality of first memory devices and a second memory device. A number of write drivers in the second memory device may be driven when a number of first memory devices among the plurality of first memory devices are used. A different number of write drivers in the second memory device may be driven when a different number of first memory devices among the plurality of first memory devices are used.

A smaller number of write drivers in the second memory device may be driven when a larger number of first memory devices among the plurality of first memory devices are used. A larger number of write drivers in the second memory device may be driven when a smaller number of first memory devices among the plurality of first memory devices are used.

The number of first memory devices that are used may be determined by checking whether each of the plurality of first memory devices is busy.

The first memory devices may be NAND flash memory devices. The second memory device may be a resistive memory device, such as a PRAM.

The number of driven write drivers in the second memory device may determine the smallest unit of data to be programmed in the second memory device.

A first command may be provided to the second memory device to select a first number of write drivers to be driven in the second memory device. A second command may be provided to the second memory device to select a second number of write drivers to be driven in the second memory device.

According to other embodiments of the inventive concept, there is provided a driving method of a memory controller to control a plurality of first memory devices and a second memory device. In this embodiment, the operational status of the plurality of first memory devices may be monitored. A command may be provided to the second memory device for selecting a number of write drivers in the second memory device to be driven based on the monitoring result.

If a first number of first memory devices are used, the command may be a first command to drive a number of write drivers in the second memory device. If fewer first memory devices are used, the command may be a second command to drive a greater number of write drivers in the second memory device.

According to other embodiments of the inventive concept, there is provided a non-volatile memory device. The non-volatile memory device may include a resistive memory cell array. The non-volatile memory device may include a plurality of write drivers which may supply a program current to the resistive memory cell array. The non-volatile memory device may include a control logic which may receive a command corresponding to number of write drivers to be programmed and may select the number of the write drivers based on the command.

According to other embodiments of the inventive concept, there is provided a memory system which may include a plurality of first memory devices, a second memory device, and a controller. The controller may control the plurality of first memory devices and the second memory device to adjust number of bits to be written simultaneously in the second memory device according to number of first memory devices that are busy among the plurality of first memory devices.

According to other embodiments of the inventive concept, there is provided a memory system which may include a plurality of first memory devices, a second memory device configured to vary the number of bits to be written simultaneously in the second memory device and a controller configured to provide a command to the second memory device in order to select the number of bits to be written simultaneously in the second memory device based upon an operational status of the plurality of first memory devices.

The second memory device may include write drivers and the command may determine the number of write drivers in the first memory device which are driven simultaneously.

The first memory devices may include NAND flash devices and the controller may be configured to monitor the busy and/or ready status of the NAND flash devices in order to provide a counted number of NAND flash devices that are busy.

The controller may be configured to select a number of bits to be written simultaneously in the second memory device which is inversely proportional to the counted number of NAND flash devices that are busy.

According to other embodiments of the inventive concept, there is provided a non-volatile memory device which may include a resistive memory cell array and a control logic. The control logic may receive a configuration command indicating a variable number of memory cells to be written simultaneously, receive a write command, and control the execution of the write command to vary the number of memory cells written simultaneously in accordance with the configuration command.

BRIEF DESCRIPTION OF THE DRAWINGS

FIG. 3 is a block diagram for explaining a resistive memory device in accordance with some embodiments of the present inventive concept;

FIG. 6 is a table showing an exemplarily set of commands provided by the memory controller to the resistive memory device.

DETAILED DESCRIPTION OF THE EMBODIMENTS

Figure 1:
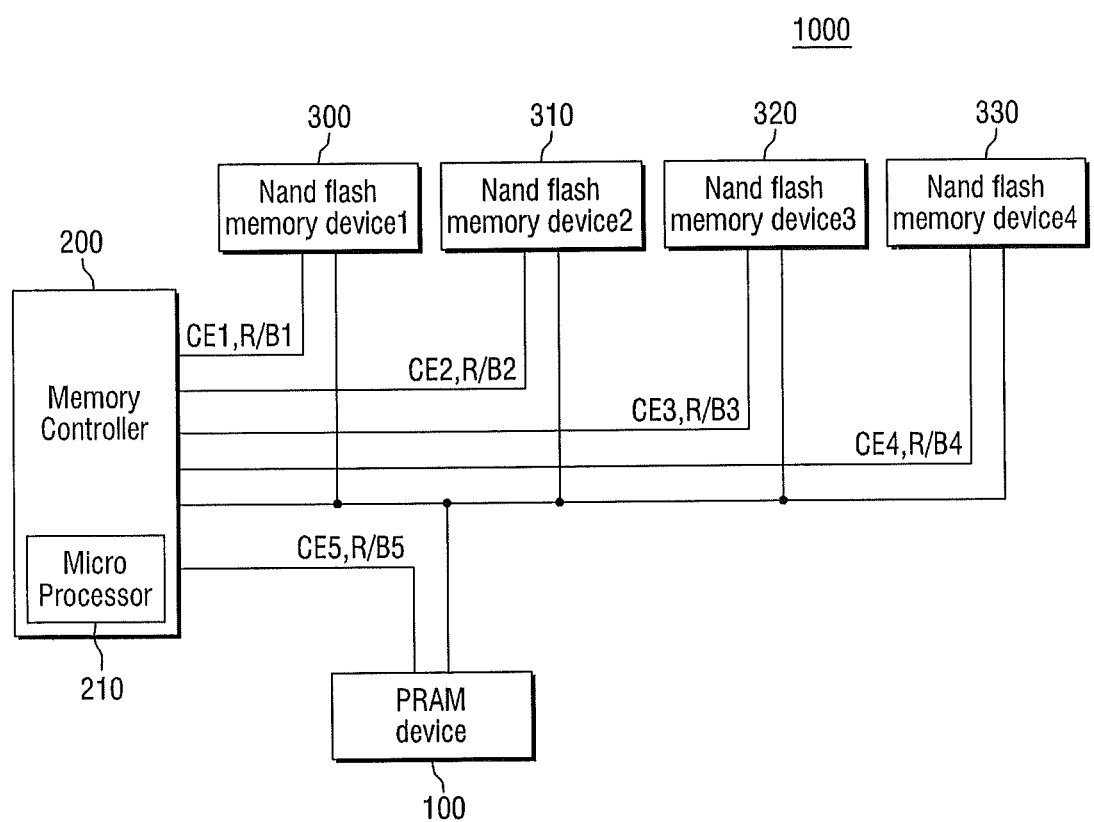
FIG. 1 is a block diagram showing a memory system including a resistive memory device in accordance with an embodiment of the present inventive concept.

Embodiments will be described in detail with reference to the accompanying drawings. The inventive concept may, however, be embodied in various different forms and should not be construed as being limited to the embodiments set forth herein. Rather, these embodiments are provided as examples so that this disclosure will be thorough and complete and will fully convey the concept of the inventive concept to those skilled in the art. In the drawings, the thickness of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The present invention is described in part below with reference to block diagrams of methods and systems according to various embodiments. It will be understood that a block of the block diagrams and combinations of blocks in the block diagrams may be implemented at least in part by software or hardware components, such as a field programmable gate array (FPGA) or an application specific integrated circuit (ASIC), which performs certain tasks. A block may advantageously be configured to reside in the addressable storage medium and configured to execute on one or more processors. Thus, a block may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the blocks may be combined into fewer blocks or further separated into additional blocks.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Hereinafter, embodiments of the present inventive concept will be described using a phase change random access memory (PRAM). However, it is obvious to those skilled in the art that the present inventive concept can be applied to a nonvolatile memory device using a resistance material such as a resistive RAM (RRAM) and a magnetic RAM (MRAM).

FIG. 1 is a block diagram showing a memory system including a resistive memory device in accordance with an embodiment of the present inventive concept.

Referring to FIG. 1, a memory system 1000 according to the embodiment of the present inventive concept may include a resistive memory device 100, a plurality of NAND flash memory devices 300, 310, 320 and 330 and a memory controller 200. FIG. 1 shows one PRAM as an example, but it is not limited thereto.

The resistive memory device 100 may include a memory cell array and logic circuits which control input/output of data to/from memory cells of the memory cell array. The resistive memory device according to the embodiment of the present inventive concept is described in detail with reference to FIGS. 2 to 11.

The NAND flash memory devices 300, 310, 320 and 330 may store user data, and may store a large capacity of data. The resistive memory device 100 may store metadata.

The memory controller 200 may control the NAND flash memory devices 300, 310, 320 and 330 and the resistive memory device 100 so as to read/write data from/into the NAND flash memory devices 300, 310, 320 and 330 and the resistive memory device 100 in response to a read/write request from a host.

The memory controller 200 may be one-to-one connected to each of the NAND flash memory devices 300, 310, 320 and 330 via an individual bus. The NAND flash memory devices 300, 310, 320 and 330 may receive ready/busy (R/B1, R/B2, R/B3, R/B4) signals and chip enable (CE1 to CE4) signals via the respective buses.

The memory controller 200 may be one-to-one connected to the resistive memory device 100 via an individual bus. The resistive memory device 100 may receive a ready/busy signal (R/B5) and a chip enable signal (CE5) via an individual bus.

Further, the plurality of NAND flash memory devices 300, 310, 320 and 330 and the resistive memory device 100 may receive address latch enable (ALE), command latch enable (CLE), write protection (WP), write enable (WE), read enable (RE), and data.

The memory controller 200 may include a microprocessor (processing unit) 210, a host interface, a memory interface and the like. The microprocessor 210 may control the operation of the memory controller 200. The microprocessor 210 may control the operation of the NAND flash memory devices 300, 310, 320 and 330 and the resistive memory device 100. The microprocessor 210 may control the resistive memory device 100 to read/write data from/into the resistive memory device 100 by monitoring a status of the NAND flash memory devices 300, 310, 320 and 330.

Further, the resistive memory device 100 and the NAND flash memory devices 300, 310, 320 and 330 may have a single interface sharing address latch enable (ALE), command latch enable (CEL), write protection (WE), read enable (RE), write enable (WE), I/O pins and the like. In this case, chip enable (CE; CE1, CE2, CE3, CE4, CE5) signals and ready/busy (R/B; R/B1, R/B2 R/B3 R/B4 R/B5) signals are allocated to the resistive memory device 100 and the NAND flash memory devices 300, 310, 320 and 330, respectively.

The host interface may include a protocol for performing data exchange between the host and the memory controller 200. For example, the memory controller 200 may be configured to perform communication with the outside (host) through one of various interface protocols such as USB, MMC, PCI-E, ATA (Advanced Technology Attachment), Serial-ATA, Parallel-ATA, SCSI, ESDI, and IDE (Integrated Drive Electronics).

The memory controller 200, the NAND flash memory devices 300, 310, 320 and 330 and the resistive memory device 100 may be integrated into one system. As an example, the memory controller 200, the NAND flash memory devices 300, 310, 320 and 330 and the resistive memory device 100 may be integrated to form a memory card. For example, they may be integrated into one semiconductor device to form a PC card (PCMCIA), compact flash card (CF), smart media card (SM/SMC), memory stick, multimedia card (MMC, RS-MMC, MMCmicro), SD card (SD, miniSD, microSD), universal flash storage device (UFS) or the like.

According to another embodiment, the resistive memory device 100 and the memory controller 200 may be integrated to form a semiconductor disk drive (SSD, Solid State Disk/Drive).

The microprocessor 210 may adjust the number of bits to be programmed simultaneously in the resistive memory device 100 by monitoring the NAND flash memory devices in a busy state among the plurality of NAND flash memory devices 300, 310, 320 and 330.

For example, the memory controller 200 may control A (A is a natural number) write drivers in the resistive memory device 100 when N (N is a natural number) NAND flash memory devices 300, 310, 320 and 330 are used. Further, the memory controller 200 may control B (B is a natural number) write drivers in the resistive memory device 100 when M (M is a natural number different from N) NAND flash memory devices 300, 310, 320 and 330 are used. In this example, if N is greater than M, A is smaller than B, and if N is smaller than M, A is greater than B.

The NAND flash memory devices 300, 310, 320 and 330 may program user data, i.e., a large capacity of data provided from the host. The resistive memory device 100 may store metadata, code data, managing data and the like. For example, the metadata may be ECC (Error correction code). The managing data may include various types of code information or mapping information of memory devices.

Figure 2:
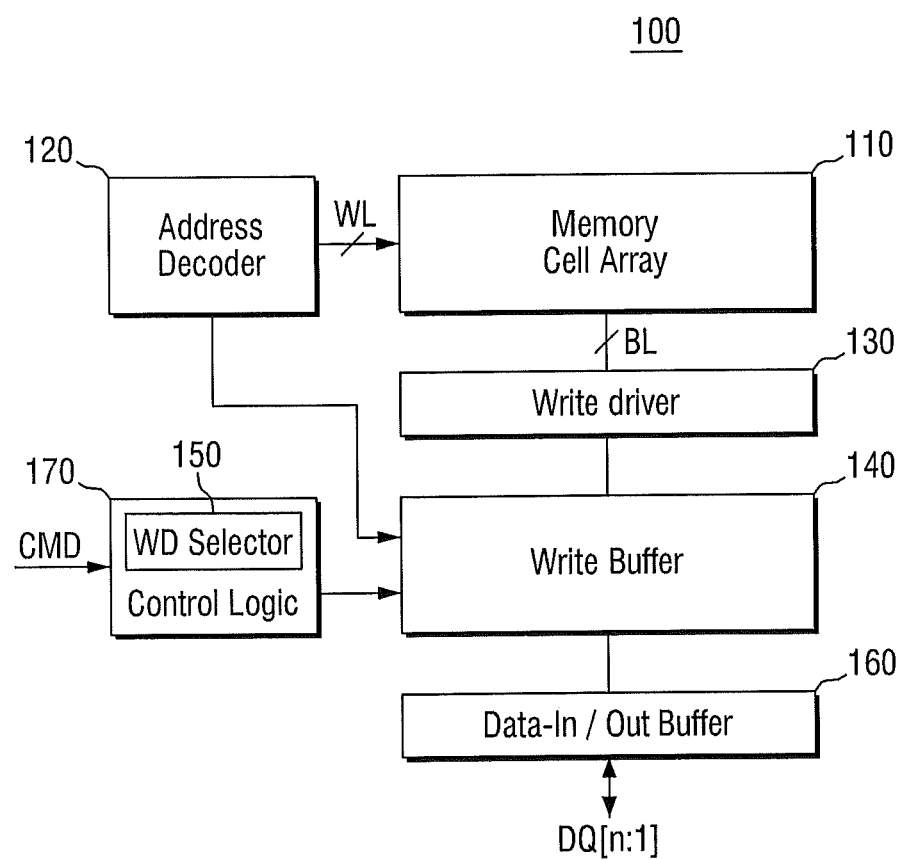
FIG. 2 is a block diagram of the resistive memory device shown in FIG. 1.

FIG. 2 is a block diagram of the resistive memory device 100 shown in FIG. 1.

Referring to FIG. 2, the resistive memory device 100 in accordance with the embodiments of the present inventive concept may include a memory cell array 110, an address decoder 120, a write driver 130, a write buffer 140, an data-in/out buffer 160 and a control logic 170. The resistive memory device may achieve bit by bit access.

The memory cell array 110 includes a plurality of words lines WL and a plurality of bit lines BL, and the memory cells are connected to intersections between the words lines WL and the bit lines BL. The configuration of the memory cell array 110 is described in detail with reference to FIGS. 3 and 4.

The address decoder 120 may be connected to the memory cell array 110 through the words lines WL. The address decoder 120 may select the words line WL and the bit line BL by coding an address ADDR inputted from the outside. The address ADDR may include a row address for selecting the words line WL and a column address for selecting the bit line BL.

The write driver 130 may program data into the memory cell array 110. Specifically, the write driver 130 may receive program pulses, verification pulses and data, and provide the program current and verification current to the memory cell array 110. The program pulses may include set pulses and reset pulses. The program current may include set current and reset current.

The write buffer 140 may temporarily store and output data to be written through the write driver 130. Further, the write buffer 140 may be used as a data cache. That is, if the write buffer 140 stores data to be accessed from the control logic 170, the write buffer 140 may output the data through the data-in/out buffer.

Further, the write buffer 140 may include a fail bit information register (not shown) storing an address of the memory cells failed in the write operation.

The data-in/out buffer 160 may provide the data inputted from the outside to the write buffer 140, or output the data read from a read circuit.

The control logic 170 may output control signals for controlling the resistive memory device according to a command signal CMD provided from the outside.

Further, the control logic 170 may control the operation of the write buffer 140 in the write operation. Specifically, the control logic 170 may provide a SET pulse or RESET pulse for generating the program current in the write operation to the write buffer 140. Then, the control logic 170 may provide a bias voltage DC_BIAS for controlling the amount of current supplied to the multi bit cell to the write buffer 140. The control logic 170 may include a write driver selector (WD selector) 150. The WD selector 150 may select the number of write drivers to perform programming according to a command (CMD) provided from the memory controller 200. Accordingly, since the WD selector 150 may selects the number of write drivers, it may be possible to determine a minimum unit of data to be programmed. Referring to FIG. 1, the memory controller may provide a command such that A (A is a natural number) write drivers in the resistive memory device are driven if N (N is a natural number) devices are used among the plurality of NAND flash memory devices. The WD selector 150, having received the command, may select A write drivers to be driven according to the command. Alternatively, the memory controller may provide a command such that B (B is a natural number) write drivers in the resistive memory device are driven if M (M is a natural number different from N) devices are used among the plurality of NAND flash memory devices. The WD selector 150, having received the command, may select B write drivers to be driven according to the command. If N is greater than M, the write drivers may be selected such that A is smaller than B. If N is smaller than M, the write drivers may be selected such that A is greater than B.

FIG. 3 is a block diagram for explaining a resistive memory device in accordance with some embodiments of the present inventive concept. FIG. 3 shows a resistive memory device including sixteen memory banks as an example but the present inventive concept is not limited thereto.

Referring to FIG. 3, the resistive memory device in accordance with the embodiments of the present inventive concept may include a memory cell array, write drivers 2_1 to 2_8 and a peripheral circuit region 3.

The memory cell array may include a plurality of memory banks 1_1 to 1_16. Each of the memory banks 1_1 to 1_16 may include a plurality of memory blocks BLK0 to BLK7. Each of the memory blocks BLK0 to BLK7 may include a plurality of resistive memory cells arranged in the form of a matrix. Banks of eight memory blocks are shown as an example, but the present inventive concept is not limited thereto.

Further, a row selection circuit and a column selection circuit may be arranged to specify a row and column of the resistive memory cells to be written/read, respectively, corresponding to each of the memory banks 1_1 to 1_16

Each of the write drivers 2_1 to 2_8 may be arranged corresponding to two memory banks to perform read and write operations in the corresponding memory banks.

Although a case where each of the write drivers 2_1 to 2_8 corresponds to two memory banks is described as an example in the embodiments of the present inventive concept, the present inventive concept is not limited thereto. For example, each of the write drivers 2_1 to 2_8 may be arranged corresponding to one memory bank or four memory banks.

In the peripheral circuit region 3, a plurality of logic circuit blocks and a voltage generation circuit may be arranged to operate the column selection circuit, the row selection circuit and the write drivers 2_1 to 2_8.

Figure 4A:
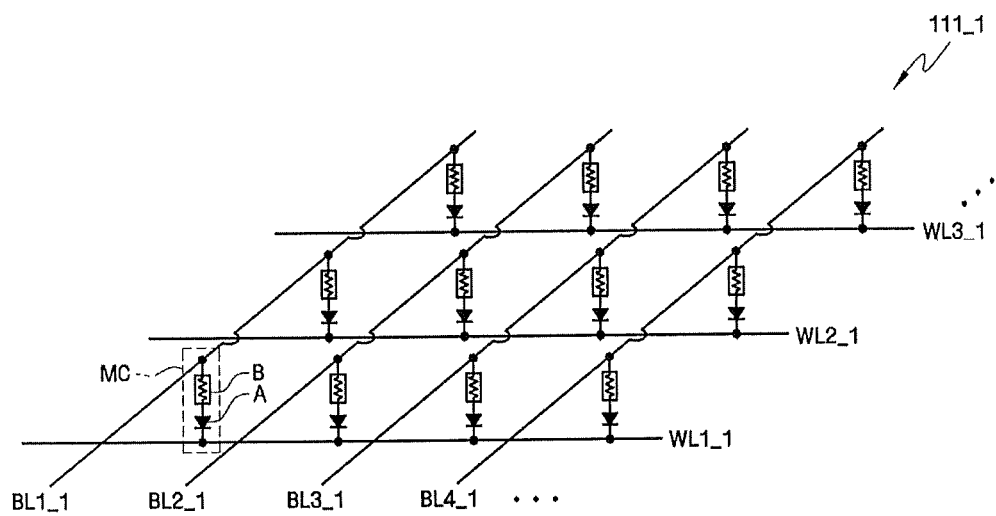
FIGS. 4A and 4B are exploded views of the memory cell arrays of FIGS. 2 and 3.
Figure 4B:
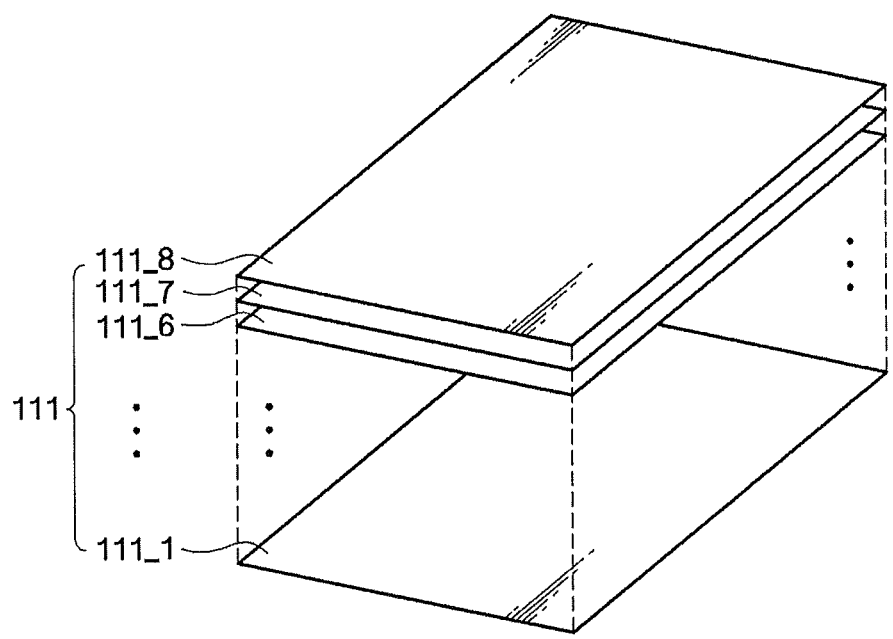

FIGS. 4A and 4B are exploded views of the memory cell arrays of FIGS. 2 and 3.

Referring to FIG. 4A, the memory cell array may have a cross point structure. The cross point structure may be a structure in which one memory cell is formed at an intersection between one line and another line. For example, the bit lines BL1_1 to BL4_1 may be formed to extend in a first direction, and the words lines WL1_1 to WL3_1 may be formed to extend in a second direction for forming an intersection between the bit lines BL1_1 to BL4_1 and the words lines WL1_1 to WL3_1. Further, a resistive memory cell MC may be formed at an intersection between each of the bit lines BL1_1 to BL4_1 and each of the words lines WL1_1 to WL3_1.

Alternatively, the memory cell array may have a three-dimensional stack structure as shown in FIG. 4B. The three-dimensional stack structure may be a shape in which a plurality of memory cell layers 111_1 to 111_8 are stacked vertically. A stack of eight memory cell layers 111_1 to 111_8 are shown as an example in the drawing, but the present inventive concept is not limited thereto. In this case, each of the memory cell layers 111_1 to 111_8 may include a plurality of memory cell groups and/or a plurality of redundancy memory cell groups. If the memory cell array has a three-dimensional stack structure, each of the memory cell layers 111_1 to 111_8 may have a cross point structure shown in FIG. 4A, but the present inventive concept is not limited thereto.

The resistive memory cell MC shown in FIG. 4A may be a resistive memory cell selected to perform a read or program operation among a plurality of resistive memory cell in the memory cell array. In this case, if the resistive memory cell MC is a PRAM, the resistive memory cell may include a variable resistor GST containing a phase change material, and an access element D controlling the current flowing through the variable resistor GST. In this case, the access element D may be a diode or transistor connected in series with the variable resistor GST. Further, as the phase change material, various kinds of materials such as GaSb, InSb, InSe, $Sb_2Te_3$ and GeTe formed by combination of two elements, GeSbTe, GaSeTe, InSbTe, $SnSb_2Te_4$ and InSbGe formed by combination of three elements, AgInSbTe, (GeSn)SbTe, GeSb(SeTe), and $Te_{81}Ge_{15}Sb_2S_2$ formed by combination of four elements may be used. Among them, GeSbTe consisting of germanium (Ge), antimony (Sb) and tellurium (Te) may be mainly used.

If the resistive memory cell MC is an RRAM, the variable resistor may include NiO or perovskite. The perovskite may be a composition such as manganite (Pr0.7Ca0.3MnO3, Pr0.5Ca0.5MnO3, PCMO, or LCMO), titanate (STO:Cr), or zirconate (SZO:Cr, Ca2Nb2O7:Cr, or Ta2O5:Cr). In the variable resistor, a filament may be formed, and the filament may become a current path of a cell current flowing through the resistive memory cell.

Figure 5:
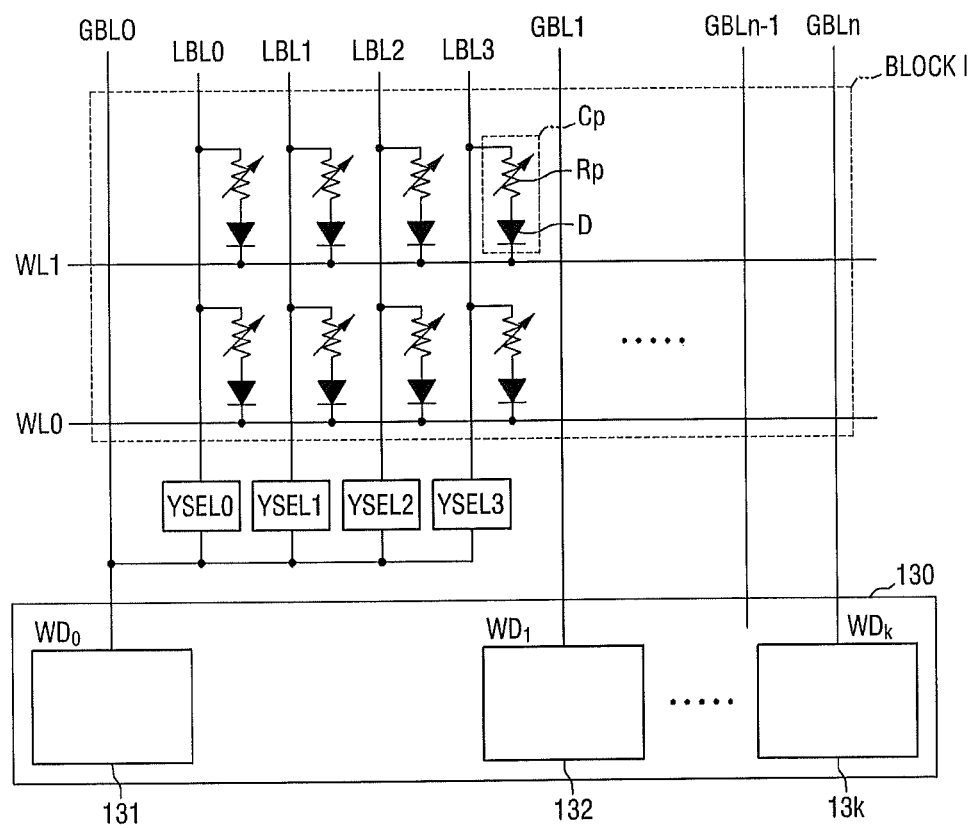
FIG. 5 is a block diagram illustrating memory cells and write drivers in accordance with some embodiments of the present inventive concept.

FIG. 5 is a block diagram illustrating memory cells and write drivers in accordance with some embodiments of the present inventive concept. FIG. 6 is a block diagram showing an exemplary set of commands provided by the memory controller to the resistive memory device.

Referring to FIGS. 5 and 6, the memory block BLK0 may include a plurality of resistive memory cells Cp, a plurality of global bit lines GBL0 to GBLn, a plurality of bit lines BL0, BL1, BL2 and BL3, a plurality of word lines WL0 and WL1, column selection transistors YSEL0 to YSEL3, and write drivers.

The plurality of resistive memory cells Cp may be located at the intersections between the word lines WL0 and WL1 and the bit lines BL0, BL1, BL2 and BL3. Particularly, the plurality of bit lines BL0, BL1, BL2 and BL3 may be branched from the global bit lines GBL0 to GBLn in order to have a hierarchical bit line structure. Specifically, the global bit lines GBL0 to GBLn may be formed to extend in one direction to be shared in the memory blocks BLK0 to BLK7 (see FIG. 3). The plurality of bit lines BL0, BL1, BL2 and BL3 may be selectively connected to the global bit lines GBL0 to GBLn through column selection transistors YSEL0 to YSEL3, respectively, and the plurality of resistive memory cells Cp may be connected to the bit lines BL0, BL1, BL2 and BL3, respectively.

The resistive memory cells Cp may be changed into a crystalline or amorphous state according to the current flowing therethrough. Each of the resistive memory cells Cp may include a phase change material Rp having a different resistance for each state, and an access element D controlling the current flowing through the phase change material Rp.

The column selection transistors YSEL0 to YSEL3 may selectively connect the global bit lines GBL0 to GBLn with the bit lines BL0, BL1, BL2 and BL3 in response to a column select signal. In this case, the column select signal may be a signal obtained by decoding a column address and block information.

Write drivers 131 to 13k may be connected to the global bit lines GBL0 to GBLk, respectively. The write drivers 131 to 13k may provide a program current to the resistive memory cells Cp to program data. The column selection transistors YSEL0 to YSEL3 may select the bit lines BL0, BL1, BL2 and BL3 in response to the column select signal to allow data to be programmed in the memory cells.

Referring to FIGS. 5 and 6, the WD selector 150 may determine the number of write drivers to be driven according to commands CMD1, CMD2, CMD3 and CMD4 provided from the memory controller.

The memory controller may check a busy status of the NAND flash memory devices, and provide a command for determining the number of write drivers to be driven in the resistive memory device based on the checked busy status to the resistive memory device.

The number of write drivers to be driven in the resistive memory device may vary according to whether the NAND flash memory devices are in a busy status. FIG. 6 shows a set of commands CMD1, CMD2, CMD3 and CMD4 to be provided to the resistive memory device. A first command CMD1 may be a command to select 4-byte write drivers and determine the smallest unit of data of 4 bytes to be programmed.

For example, if the PRAM receives the first command CMD1, the write driver selector may select 4-byte write drivers. In this case, the PRAM may consume current Io, and the current Io may be 10 mA. If the PRAM receives the first command CMD1 to program 1 kB of data, 256 write cycles may be consumed.

If the PRAM receives a second command CMD2, the write driver selector may select 8-byte write drivers. In this case, the PRAM may consume current 2*Io, and the current 2*Io may be 20 mA. If the PRAM receives the second command CMD2 to program 1 kB of data, 128 write cycles may be consumed.

If the PRAM receives a third command CMD3, the write driver selector may select 16-byte write drivers. In this case, the PRAM may consume current 4*Io, and the current 4*Io may be 40 mA. If the PRAM receives the third command CMD3 to program 1 kB of data, 64 write cycles may be consumed.

If the PRAM receives a fourth command CMD4, the write driver selector may select 32-byte write drivers. In this case, the PRAM may consume current 8*Io, and the current 8*Io may be 80 mA. If the PRAM receives the fourth command CMD4 to program 1 kB of data, 32 write cycles may be consumed.

Thus, as the number of write drivers selected increases, the smallest unit of data to be programmed in the resistive memory device may increase, and the consumed current may also increase.

Figure 7:
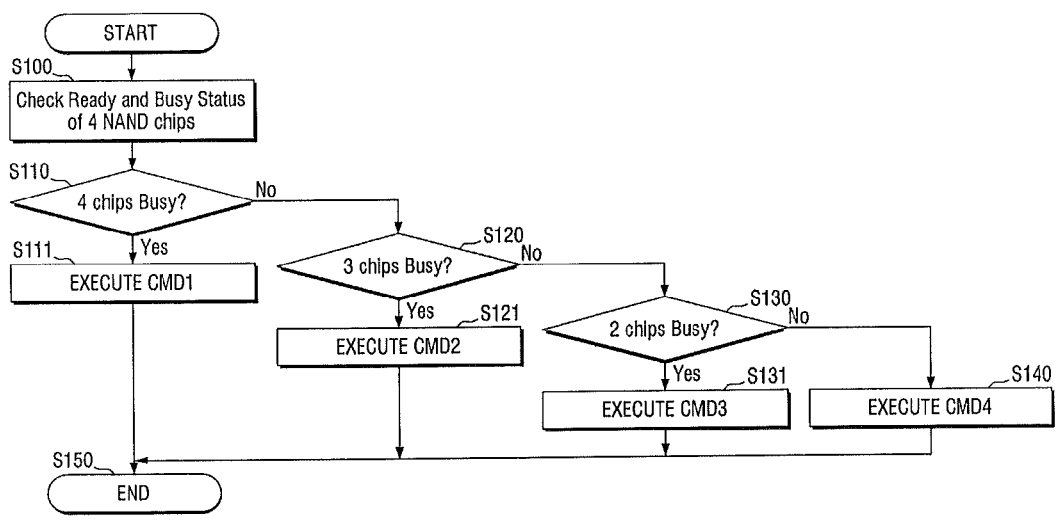
FIG. 7 is a flowchart showing an operation method of the resistive memory device and the memory controller in accordance with the embodiment of the present inventive concept.

FIG. 7 is a flowchart showing an operation method of the resistive memory device and the memory controller in accordance with the embodiment of the present inventive concept. The description of FIG. 7 is made with reference to FIGS. 1 and 6. The memory controller may check an operation status of the NAND flash memory devices (S100). Specifically, as illustrated in FIG. 1, the memory controller may check a ready or busy status of four NAND flash memory devices.

In this case, if all of four NAND flash memory devices are busy (S110), the memory controller may provide the first command CMD1 to the resistive memory device. Then, the resistive memory device may execute the first command (S111). Then, the operation of the resistive memory device may be terminated.

Alternatively, if one NAND flash memory device is not busy, and three NAND flash memory devices are busy (S120), the memory controller may provide the second command to the resistive memory device. Then, the resistive memory device may execute the second command (S121). Then, the operation of the resistive memory device may be terminated.

Alternatively, if two NAND flash memory devices are not busy, and two NAND flash memory devices are busy (S130), the memory controller may provide the third command to the resistive memory device. Then, the resistive memory device may execute the third command (S131). Then, the operation of the resistive memory device may be terminated.

Alternatively, if at least three NAND flash memory devices are not busy, and at most one NAND flash memory device is busy (S130), the memory controller may provide the fourth command to the resistive memory device. Then, the resistive memory device may execute the fourth command (S140). Then, the operation of the resistive memory device may be terminated.

The first command CMD1, the second command CMD2, the third command CMD3 and the fourth command CMD4 may be the same as the set of commands shown in FIG. 6.

Figure 8:
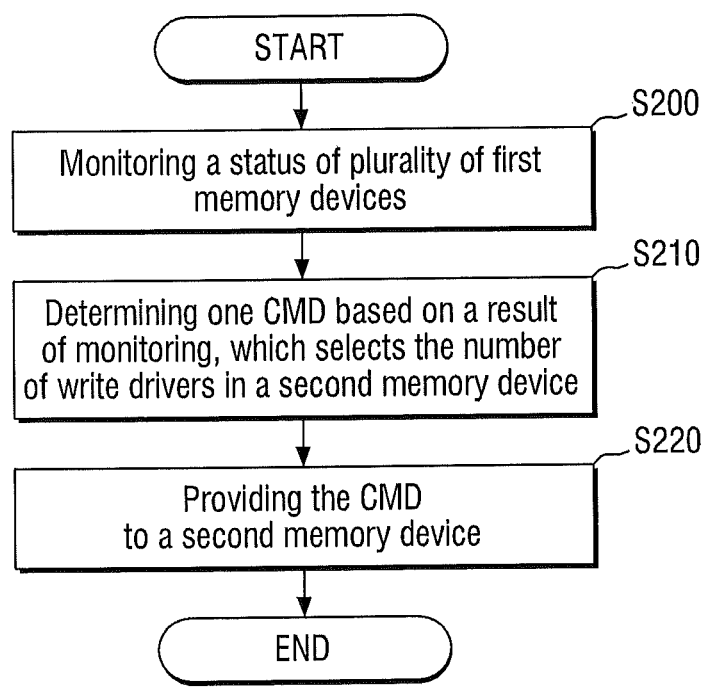
FIG. 8 is a flowchart showing the operation of the memory controller in accordance with another embodiment of the present inventive concept.

FIG. 8 is a flowchart showing the operation of the memory controller in accordance with another embodiment of the present inventive concept.

Referring to FIG. 8, the memory controller may control a plurality of first memory devices and a second memory device of a kind different from that of the first memory devices. For example, the first memory devices may be NAND flash memory devices, and the second memory device may be a resistive memory device such as PRAM, MRAM, or ReRAM. The memory controller may monitor the operation status of the first memory devices (S200). To monitoring the operation status, the memory controller may check whether each of the first memory devices is busy.

Then, the memory device may determine a command to select the number of write drivers to be driven by the second memory device on the basis of the monitoring results (S210), and provide the determined command to the second memory device (S220).

If N first memory devices are used, the command may be a first command to drive A write drivers. Further, if M (M is smaller than N) write drivers are used as the first memory devices, the command may be a second command to drive B (B is greater than A) write drivers.

Figure 9:
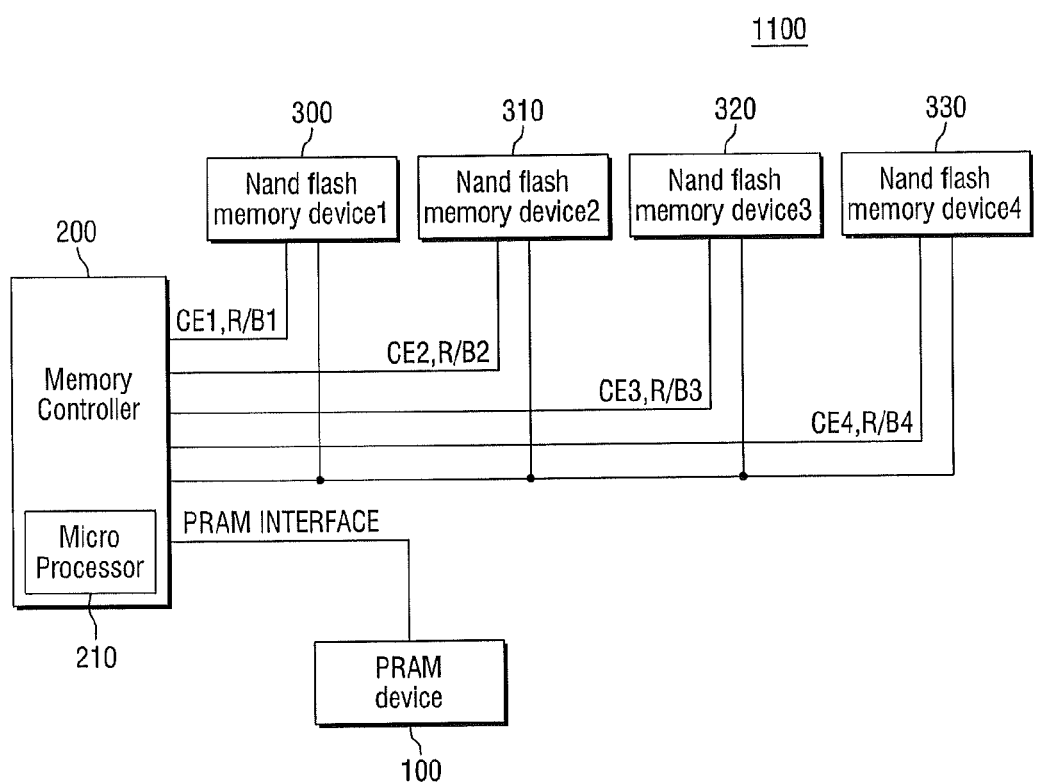
FIG. 9 is a block diagram showing a memory system including a resistive memory device in accordance with another embodiment of the present inventive concept.

FIG. 9 is a block diagram showing a memory system including a resistive memory device in accordance with another embodiment of the present inventive concept.

Referring to FIG. 9, as described in FIG. 1, a memory system 1100 may include a memory controller 200, NAND flash memory devices 300, 310, 320 and 330 and a resistive memory device 100.

The memory controller 200 may provide different interfaces to the NAND flash memory devices 300, 310, 320 and 330 and the resistive memory device 100.

Although the drawings show the interface of the resistive memory device 100 as a PRAM interface, the present inventive concept is not limited thereto. For example, the interface of the resistive memory device 100 may be an interface such as DDR, SRAM and NOR.

The memory controller 200 and the NAND flash memory devices 300, 310, 320 and 330 may transmit a signal through a shared bus and an individual bus.

However, the resistive memory device 100 may receive a signal of a command from the memory controller 200 via a separate bus. Accordingly, the resistive memory device 100 may not use a shared bus.

FIGS. 10 to 14 are block diagrams for explaining memory systems in accordance with some embodiments of the present inventive concept. In this case, FIGS. 10 to 14 relate to memory systems using a non-volatile memory device in accordance with the embodiments of the present inventive concept.

Figure 10:
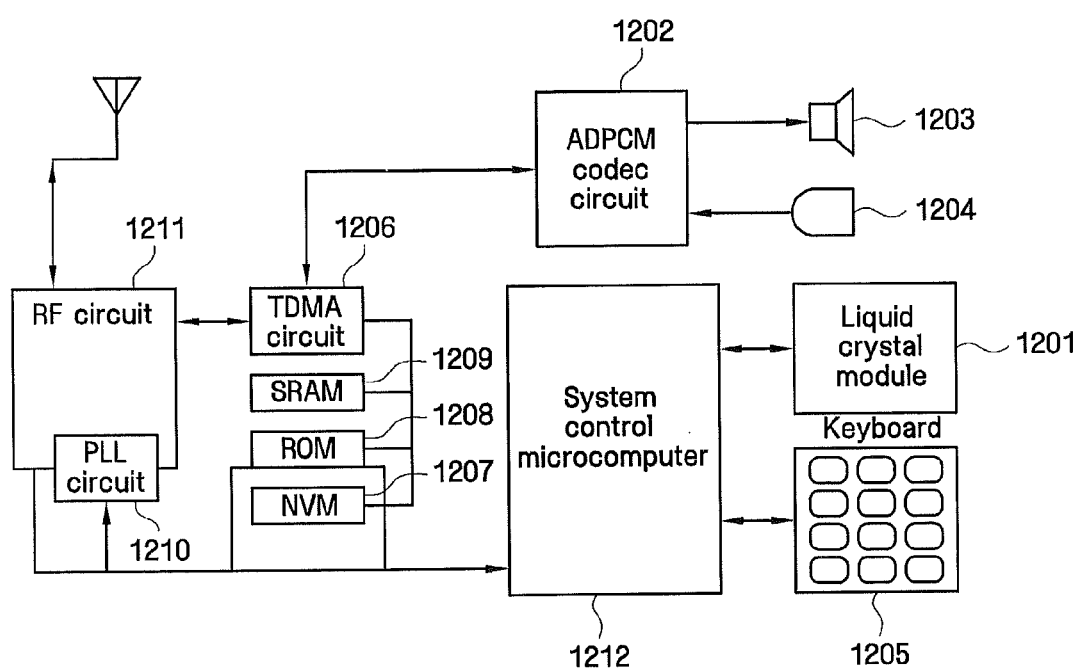
FIGS. 10 to 14 are block diagrams for explaining memory systems in accordance with some embodiments of the present inventive concept.

FIG. 10 is an exemplary block diagram of a cellular phone system using a non-volatile memory device in accordance with the embodiments of the present inventive concept.

Referring to FIG. 10, the cellular phone system may include an ADPCM codec circuit 1202 for compressing sound or decompressing the compressed sound, a speaker 1203, a microphone 1204, a TDMA circuit 1206 for time-division multiplexing digital data, a PLL circuit 1210 for setting a carrier frequency of a radio signal, and a RF circuit 1211 for transmitting or receiving a radio signal.

Further, the cellular phone system may include various types of memory devices. For example, the cellular phone system may include anon-volatile memory device 1207, a ROM 1208, and an SRAM 1209. As the non-volatile memory device 1207, the non-volatile memory device in accordance with the embodiments of the present inventive concept may be used, and for example, an ID number may be stored. The ROM 1208 may store a program, and the SRAM 1209 may serve as a work area for a system control microcomputer 1212, or temporarily store data. In this case, the system control microcomputer 1212 may serve as a processor to control a write operation and read operation of the non-volatile memory device 1207.

Figure 11:
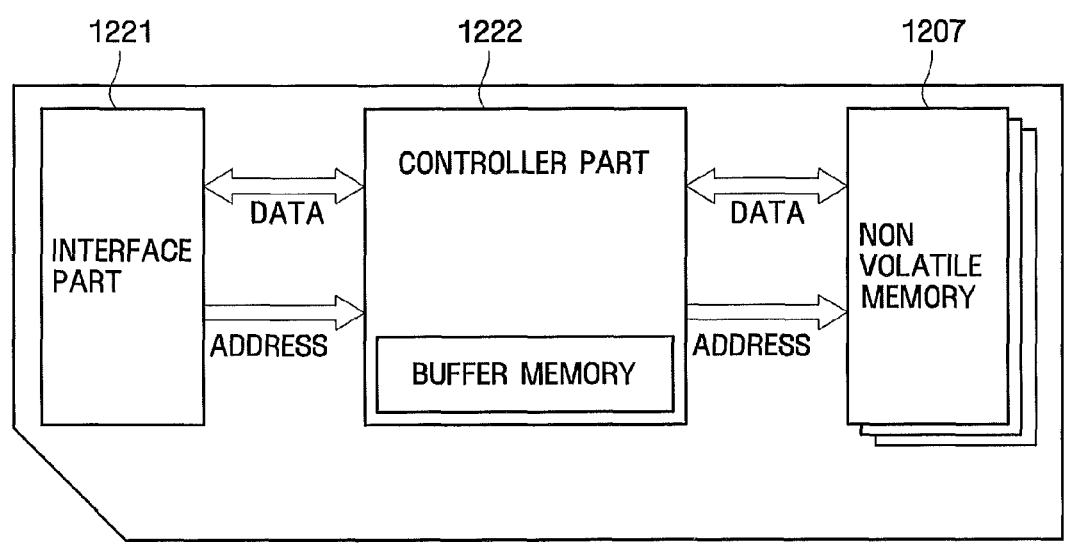

FIG. 11 is an exemplary block diagram of a memory card using a non-volatile memory device in accordance with the embodiments of the present inventive concept. The memory card may be an MMC card, SD card, multiuse card, micro SD card, memory stick, compact SD card, ID card, PCMCIA card, SSD card, chip card, smart card, or USB card.

Referring to FIG. 11, the memory card may include an interface part 1221 to perform interfacing with the outside, a controller part 1222 having a buffer memory to control the operation of the memory card, and at least one non-volatile memory device 1207 in accordance with the embodiments of the present inventive concept. The controller part 1222 may serve as a processor to control write and read operations of the non-volatile memory device 1207. Specifically, the controller part 1222 may be coupled to the non-volatile memory device 1207 and the interface part 1221 via a data bus (DATA) and an address bus (ADDRESS).

Figure 12:
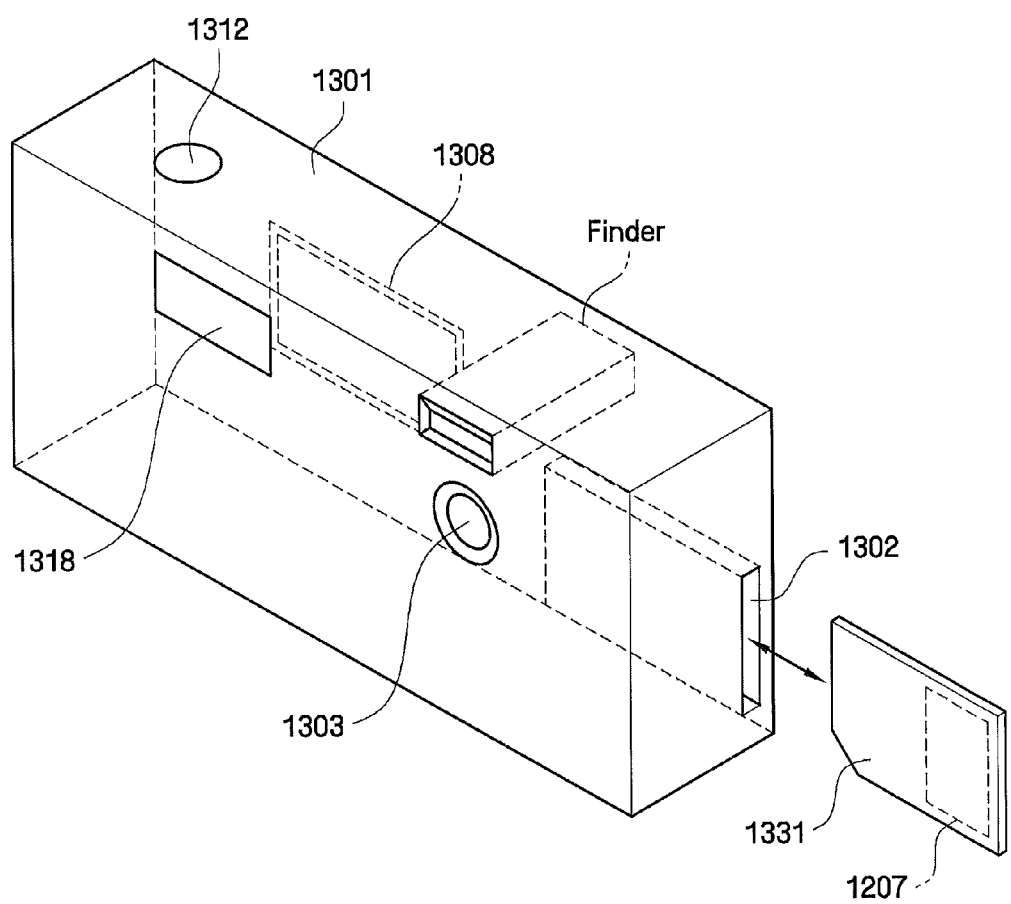

FIG. 12 is an exemplary block diagram of a digital still camera using a non-volatile memory device in accordance with the embodiments of the present inventive concept.

Referring to FIG. 12, the digital still camera may include a body 1301, a slot 1302, a lens 1303, a display unit 1308, a shutter button 1312, and a strobe 1318. In particular, a memory card 1331 may be inserted in the slot 1302, and the memory card 1331 may include at least one non-volatile memory device 1207 in accordance with the embodiments of the present inventive concept.

If the memory card 1331 is of a contact type, when the memory card 1331 is inserted into the slot 1308, the memory card 1331 may be in electrical contact with a particular electrical circuit on the circuit board. If the memory card 1331 is of a non-contact type, the memory card 1331 may communicate with a particular electrical circuit on the circuit board through a wireless signal.

Figure 13:
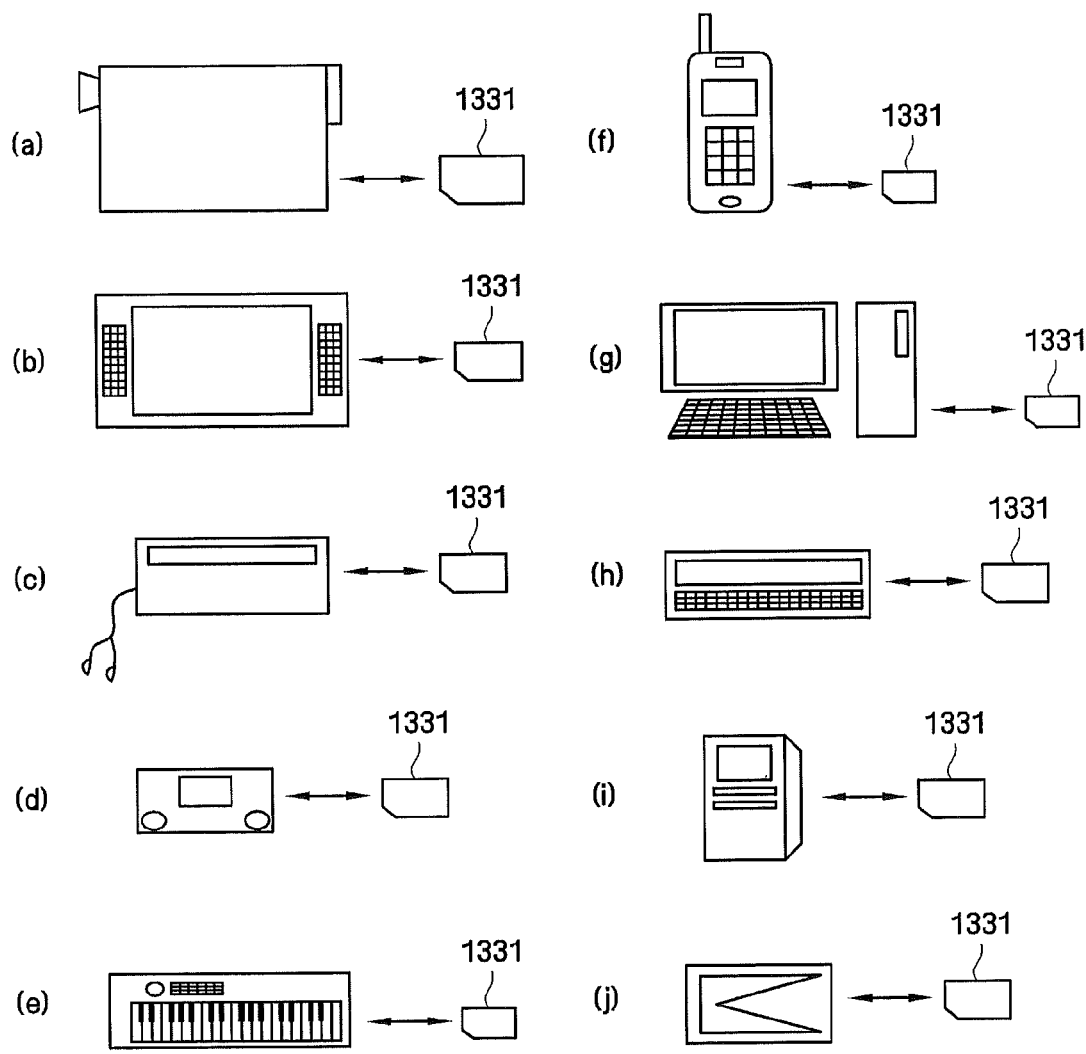

FIG. 13 is an exemplary block diagram for explaining various systems using the memory card of FIG. 11.

Referring to FIG. 13, the memory card 1331 may be used in (a) video camera, (b) television, (c) audio device, (d) game console, (e) electronic music device, (f) mobile phone, (g) computer, (h) personal digital assistant (PDA), (i) voice recorder, or (j) PC card.

Figure 14:
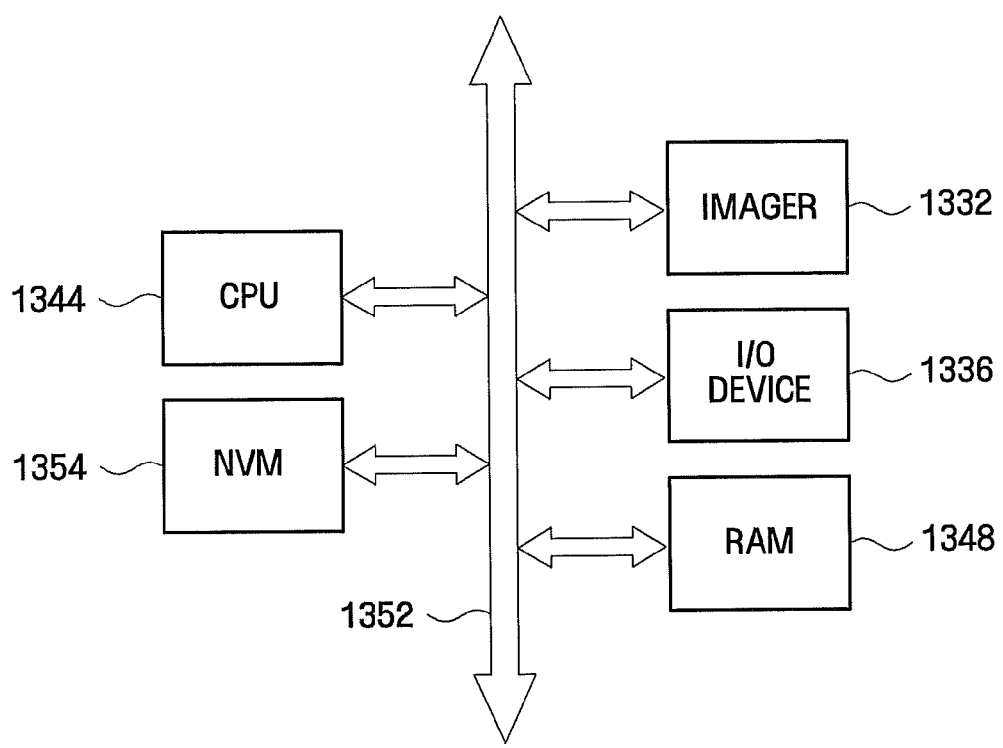

FIG. 14 is an exemplary block diagram of an image sensor system using a non-volatile memory device in accordance with the embodiments of the present inventive concept.

Referring to FIG. 14, the image sensor system may include an image sensor 1332, an input/output device 1336, a RAM 1348, a CPU 1344, and a non-volatile memory device 1354 in accordance with the embodiments of the present inventive concept. The components, such as the image sensor 1332, the input/output device 1336, the RAM 1348, the CPU 1344 and the non-volatile memory device 1354 may communicate with each other via a bus 1352. The image sensor 1332 may include a photo sensing element such as a photogate and a photodiode. Each of the components may be configured as a single chip with a processor, or may be configured as a separate chip from the processor.

Figure 15:
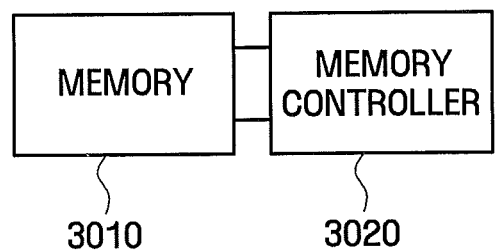
FIG. 15 is a block diagram of an exemplary memory system using a non-volatile memory device in accordance with the embodiments of the present inventive concept.

FIG. 15 is a block diagram of an exemplary memory system using a non-volatile memory device in accordance with the embodiments of the present inventive concept.

As illustrated, a memory 3010 may be coupled to a memory controller 3020. The memory 3010 may be a memory according to any of the above-described embodiments. The memory controller 3020 may provide an input signal for controlling the operation of the memory 3010. For example, the memory controller 3020 may transmit a command CMD and an address signal. The memory controller 3020 may include a memory interface, a host interface, an ECC circuit, a central processing unit (CPU), a buffer memory and the like. The memory interface may transmit data from the buffer memory to the memory 3010, and may read data from the memory 3010 and transmit the data to the buffer memory. Further, the memory interface may transmit a command or address from the external host to the memory 3010.

The host interface may communicate with the external host through a Universal Serial Bus (USB), Small Computer System Interface (SCSI, PCI express, ATA, Parallel ATA (PATA), Serial ATA (SATA), or Serial Attached SCSI (SAS).

The memory system in accordance with the embodiments of the present inventive concept may have an ECC circuit. The ECC circuit may generate parity bits by using data transmitted to the memory 3010. The generated parity bits may be stored with the data in a specific area of the memory 3010. The ECC circuit may detect an error of the data read from the memory 3010. If the detected error is correctable, the ECC circuit may correct the data.

The CPU may control the external host or the memory 3010 through a host interface or memory interface. The CPU may control write, read, erase operations according to the firmware for driving the memory.

The buffer memory may temporarily store write data provided from the external host or the data read from the memory 3010. Further, the buffer memory may store metadata or cache data to be stored in the memory 3010. During a sudden power-off operation, the metadata or cache data stored in the buffer memory may be stored in the memory 3010. The buffer memory may be DRAM or SRAM.

Figure 16:
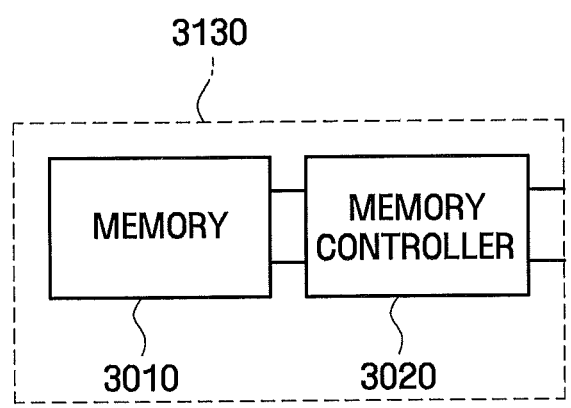
FIG. 16 is a block diagram of an exemplary memory system using a non-volatile memory device in accordance with the embodiments of the present inventive concept.

FIG. 16 is a block diagram of another exemplary memory system using a non-volatile memory device in accordance with the embodiments of the present inventive concept. The memory 3010 and the memory controller 3020 may be embedded in a card 3130. For example, the card 3130 may be a flash memory card. That is, the card 3130 may be a standard product used in a consumer electronic apparatus such as a digital camera and a personal computer. The memory controller 3020 may control the memory 3010 according to a control signal provided from another device (external device).

Figure 17:
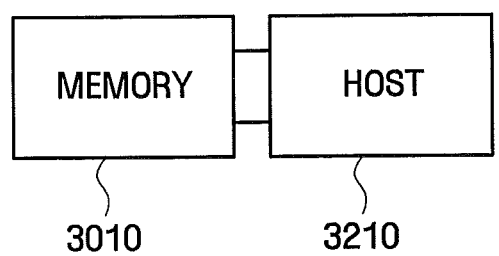
FIG. 17 is a block diagram of an exemplary memory system using a non-volatile memory device in accordance with the embodiments of the present inventive concept.

FIG. 17 is a block diagram of another exemplary memory system using a non-volatile memory device in accordance with the embodiments of the present inventive concept. The memory 3010 may be coupled to a host system 3210. The host system 3210 may be a processing system such as a personal computer and a digital camera. The host system 3210 may use the memory 3010 as a storage device that can erase the data. The host system 3210 may provide an input signal for controlling the memory 3010. For example, the host system 3210 may provide a command CMD and an address signal.

Figure 18:
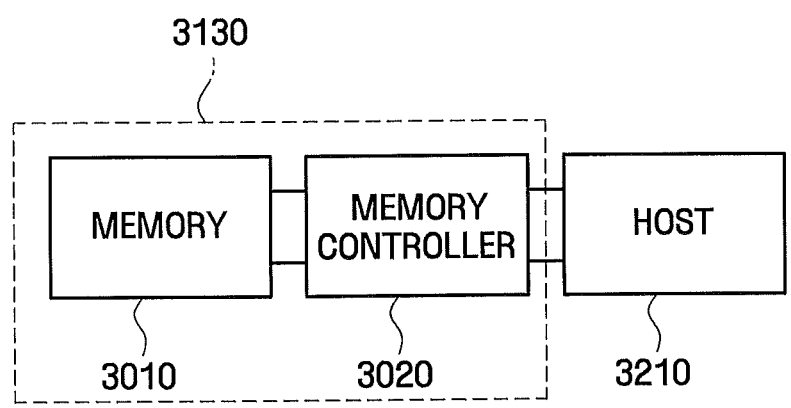
FIG. 18 is a block diagram of an exemplary memory system using a non-volatile memory device in accordance with the embodiments of the present inventive concept.

FIG. 18 is a block diagram of another exemplary memory system using a non-volatile memory device in accordance with the embodiments of the present inventive concept. The host system 3210 and the card 3130 are coupled to each other. The host system 3210 may provide a control signal to the card 3130 to allow the memory controller 3020 to control the memory 3010.

Figure 19:
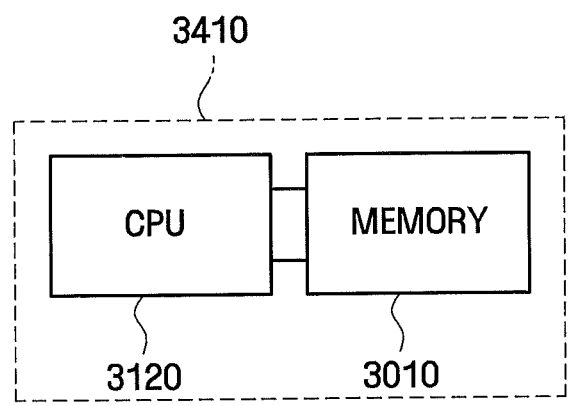
FIG. 19 is a block diagram of an exemplary memory system using a non-volatile memory device in accordance with the embodiments of the present inventive concept.

FIG. 19 is a block diagram of another exemplary memory system using a non-volatile memory device in accordance with the embodiments of the present inventive concept. The memory 3010 may be stored in a CPU 3120 of a computer system 3410. For example, the computer system 3410 may be a personal computer or PDA. The memory 3010 may be directly connected to the CPU 3120 via a bus.

The non-volatile memory device in accordance with the embodiments of the present inventive concept may be used as a storage class memory (SCM). The SCM may have both non-volatile characteristics and access characteristics. The SCM may be used as a data storage area and program operating area.

A non-volatile memory device using a resistance material, such as PRAM, RRAM, and MRAM, may be used as the SCM. The SCM may be used as a data storage memory instead of a flash memory, and may be used as a main memory instead of an SRAM. One SCM may replace the flash memory and the SRAM.

Figure 20:
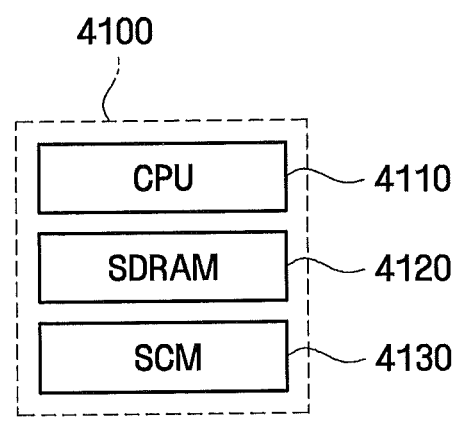
FIG. 20 is a block diagram illustrating an exemplary memory system using an SCM.

FIG. 20 is a block diagram illustrating an exemplary memory system using the SCM. A memory system 4100 may include a CPU 4110, an SDRAM 4120 and an SCM 4130 used instead of a flash memory.

In the memory system 4100, the data access speed of the SCM 4130 may be faster than the speed of the flash memory. For example, in the PC environment, when the CPU 4110 operates at 4 GHz, the access speed of the PRAM, which is one kind of the SCM, may be about 32 times faster than the access speed of the flash memory. Accordingly, the memory system 4100 may obtain a higher-speed access gain than a memory system including a flash memory.

Figure 21:
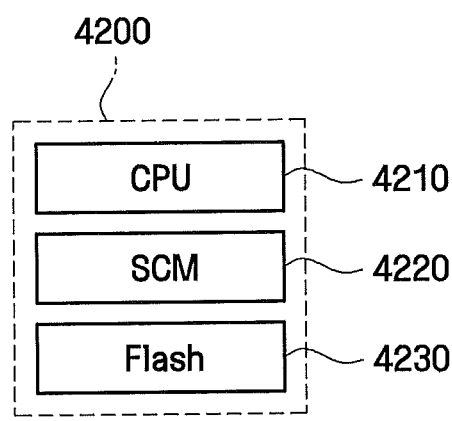
FIG. 21 is a block diagram illustrating an exemplary memory system using an SCM.

FIG. 21 is a block diagram illustrating another exemplary memory system using the SCM. A memory system 4200 may include a CPU 4210, an SCM 4220 used instead of an SDRAM, and a flash memory 4230.

In the memory system 4200, the power used by the SCM 4220 may be smaller than the power used by the SDRAM. The energy used by the main memory of the computer system may be about 40% of the energy used in the entire system. Accordingly, many people make an effort to reduce the energy used in the main memory. By using the SCM, it may be possible to reduce the use of dynamic energy by about 53% on average, and reduce the use of energy caused by leakage of power by about 73% on average. As a result, in the memory system 4200, it may be possible to reduce the energy compared to a memory system including an SDRAM.

Figure 22:
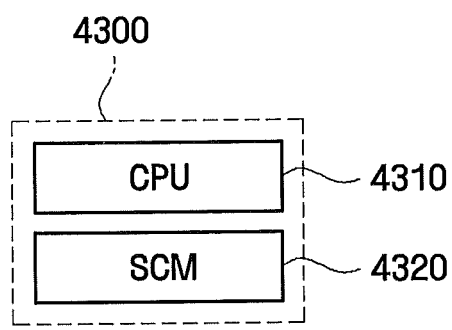
FIG. 22 is a block diagram illustrating an exemplary memory system using an SCM.

FIG. 22 is a block diagram illustrating another exemplary memory system using the SCM. A memory system 4300 may include a CPU 4310, an SDRAM, and an SCM 4320 used instead of a flash memory. The SCM 4320 may be used as a main memory instead of an SDRAM, and used as a data storage memory instead of a flash memory. The memory system 4300 has an advantage in data access speed, low power, space utilization, and cost. While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A driving method of a memory controller to control a plurality of first memory devices and a second memory device, the method comprising:

driving A (A is a natural number) write drivers in the second memory device when N (N is a natural number) first memory devices among the plurality of first memory devices are used; and driving B (B is a natural number different from A) write drivers in the second memory device when M (M is a natural number different from N) first memory devices among the plurality of first memory devices are used.

2. The driving method of claim 1, wherein if N is greater than M, then A is smaller than B.

3. The driving method of claim 2, wherein if N is smaller than M, then A is greater than B.

4. The driving method of claim 1, further comprising checking whether each of the plurality of first memory devices is busy to determine the number of first memory devices that are used.

5. The driving method of claim 1, wherein the first memory devices are NAND flash memory devices.

6. The driving method of claim 1, wherein the second memory device is a resistive memory device.

7. The driving method of claim 6, wherein the second memory device is a PRAM.

8. The driving method of claim 1, wherein the number of driven write drivers in the second memory device determine the smallest unit of data to be programmed in the second memory device.

9. The driving method of claim 1, wherein driving A write drivers in the second memory device comprises providing a first command for selecting the A write drivers to the second memory device.

10. The driving method of claim 9, wherein driving B write drivers in the second memory device comprises providing a second command for selecting the B write drivers to the second memory device.

11. A driving method of a memory controller to control a plurality of first memory devices and a second memory device, the method comprising:
monitoring an operation status of the plurality of first memory devices; and
providing a command to the second memory device for selecting number of write drivers in the second memory device to be driven based on the monitoring result.

12. The driving method of claim 11, wherein if N (N is a natural number) first memory devices are used, the command is a first command to drive A (A is a natural number) write drivers in the second memory device.

13. The driving method of claim 12, wherein if M (M is a natural number smaller than N) first memory devices are used, the command is a second command to drive B (B is a natural number greater than A) write drivers in the second memory device.

14. A memory system comprising:
a plurality of first memory devices;
a second memory device configured to vary a number of bits to be written simultaneously in the second memory device; and
a controller configured to provide a command to the second memory device to select the number of bits to be written simultaneously in the second memory device based upon an operational status of the plurality of first memory devices.

15. The memory system of claim 14, wherein the second memory device comprises write drivers and the command determines the number of the write drivers in the second memory device which are driven simultaneously.

16. The memory system of claim 14, wherein the plurality of first memory devices comprise a plurality of NAND flash devices and the controller is configured to monitor the busy and/or ready status of the NAND flash devices to provide a counted number of NAND flash devices that are busy.

17. The memory system of claim 16, wherein the controller is configured to select the number of bits to be written simultaneously in the second memory device which is inversely proportional to the counted number of NAND flash devices that are busy.

* * * * *